United States Patent [19]

Cutler

[11] Patent Number: 4,746,878
[45] Date of Patent: May 24, 1988

[54] C. W. LASER WAVEMETER/FREQUENCY LOCKING TECHNIQUE

[75] Inventor: Gregory M. Cutler, Mountain View, Calif.

[73] Assignee: Hewlett-Packard Company, Palo Alto, Calif.

[21] Appl. No.: 883,238

[22] Filed: Jul. 8, 1986

Related U.S. Application Data

[62] Division of Ser. No. 727,457, Apr. 26, 1985.

[51] Int. Cl.[4] .............................................. H03L 7/16
[52] U.S. Cl. .................................... 331/9; 324/78 R; 324/81; 324/83 FE; 331/44
[58] Field of Search ............................ 331/9, 44, 64; 324/78 R, 81, 83 FE, 83 FM

[56] References Cited

U.S. PATENT DOCUMENTS 3,597,699  8/1971  Seipel ................................ 331/44 X Primary Examiner—Paul Gensler
Assistant Examiner—James C. Lee
Attorney, Agent, or Firm—John A. Frazzini

[57] ABSTRACT

A wavemeter/frequency locking technique suitable for indirectly locking an optical frequency $f_0$ to a radio frequency $f_1$ or for locking the radio frequency to the optical frequency. A beam of optical frequency $f_0$ is phase modulated by a signal of average frequency $f_1$ that is itself modulated at frequency $f_2$. The modulated beam is passed through a filter to a detector to produce a detector output signal that has components at linear integral sums of $f_1$ and $f_2$. A pair of control signals are generated that are proportional to the amplitude of two of the components of the detector output signal. These control signals are separately used in a pair of servo loops to separately establish fixed values of $f_0/f_f$ and $f_1/f_f$, where $f_f$ is a characteristic frequency of the filter. A method is presented for stepping the value of $f_0/f_f$ to another value and measuring $f_1/f_2$ at each of these values, thereby enabling the value of $f_0$ to be determined.

16 Claims, 9 Drawing Sheets

OPTICAL FREQUENCY COUNTER USING THE FM SUBCARRIER PHASE MODULATION TECHNIQUE

OPTICAL FREQUENCY COUNTER USING THE FM SUBCARRIER PHASE MODULATION TECHNIQUE

| REFERENCE PHASE | RESULTING SIGNAL |
|---|---|
| $+SIN(2\pi f_1 t)$ | $2I_0 P_0 SIN(2\pi f_0/f_f)$ |
| $+SIN(2\pi f_2 t)$ | $(1/2)I_0(P_0/f_0)^2 dE * COS(2\pi f_0/f_f)$ |
| $-SIN(2\pi f_1 t)$ | $-2I_0 P_0 SIN(2\pi f_0/f_f)$ |
| $-SIN(2\pi f_2 t)$ | $-(1/2)I_0(P_0/f_0)^2 dE * COS(2\pi f_0/f_f)$ |

FIG 8A

| REFERENCE PHASE | RESULTING SIGNAL |
|---|---|
| $+SIN(2\pi f_1 t)$ | $SIN(2\pi f_0/f_f)$ |
| $+SIN(2\pi f_2 t)$ | $-COS(2\pi f_0/f_f)$ |
| $-SIN(2\pi f_1 t)$ | $-SIN(2\pi f_0/f_f)$ |
| $-SIN(2\pi f_2 t)$ | $COS(2\pi f_0/f_f)$ |

FIG 8B

OPTICAL FREQUENCY COUNTER USING THE FM SUBCARRIER PHASE MODULATION TECHNIQUE

C. W. LASER WAVEMETER/FREQUENCY LOCKING TECHNIQUE

CROSS REFERENCE TO RELATED APPLICATION

This is a division of application Ser. No. 727,457, filed Apr. 26, 1985.

BACKGROUND OF THE INVENTION

The disclosed invention relates in general to the comparison of an optical frequency to a radio frequency and more particularly to a technique that enables a rational ratio N/M to be established between an optical frequency and a radio frequency (RF). In one technique presented in the article Z. Bay, et al, Measurement of an Optical Frequency and the Speed of Light, *Phys. Rev. Let.*, vol 29, No. 3, 17 July 1972 p. 189, a laser beam of frequency $f_1$ is modulated at radio frequency $f_2$ before passing through a Fabry-Perot interferometer cavity. The length L of the cavity and $f_2$ are adjusted so that the maximum intensities of both sidebands (i.e., at $f_1+f_2$ and $f_1-f_2$) pass through the cavity. A first etalon prevents the carrier frequency $f_1$ from entering the interferometer cavity and a pair of tuned etalons separately pass each sideband after the laser beam passes through the interferometer cavity. $f_1$ is adjusted in response to the difference in the two sideband signals and L is adjusted in response to the sum of the two sideband signals.

Unfortunately, this technique is not suitable for use over a broad spectral range. First, to avoid unwanted feedback that can produce a shift in the laser frequency or even stop it from lasing, an isolator containing a quarter wave plate is included in the laser beam path between the laser and the interferometer. Because a quarter wave plate cannot produce exactly one quarter wave retardation over a wide laser frequency range, this technique is not suitable over a broad spectral range. Second, the etalons would need to be gang tuned to the laser wavelength. This tuning would itself require some kind of moderate accuracy wavemeter, thereby limiting the spectral range of practical utility.

SUMMARY OF THE INVENTION

In accordance with the disclosed preferred embodiment, a phase modulation technique and associated apparatus are presented that enable an optical frequency $f_0$ of a coherent collimated continuous wave (CW) source to be locked to a radio frequency $f_1$. The relationship is established by use of a filter and a pair of servo loops.

The optical beam is phase modulated with a subcarrier of frequency $f_1$ that is itself modulated at frequency $f_2$. In the preferred embodiment, this modulation is itself pure phase modulation. It is well known that phase is the time integral of frequency and therefore phase modulation with p(t) is identical to frequency modulation with dp(t)/dt. The modulated light beam passes through a filter to a detector which, in response to the incident light beam produces a detector output signal. Interferometers such as a Fabry-Perot interferometer (acting in either reflection or transmission mode) or a Michelson interferometer are suitable choices for the filter. When a Fabry Perot interferometer is utilized, it should be of the type having 3 or more mirrors so that reflections from the mirrors do not get directed back into the CW source. The interferometers exhibit transfer functions that are periodic functions of frequency. The period of the transfer function is a fundamental frequency $f_f$ determined by the speed of light and the dimensions of interferometer. At points of amplitude symmetry, the curve of the phase shift introduced by the transfer function is antisymmetric.

A first phase synchronous amplifier is responsive to the detector output signal and a first reference signal to produce a first control signal. Similarly a second phase synchronous amplifier is responsive to the detector output signal and a second reference signal to produce a second control signal. The first control signal is utilized in a first servo loop to lock optical frequency $f_0$ to $(N+\frac{1}{2})$ times $f_f$ where N is a large integer and the second control signal is utilized in second servo loop to lock radio frequency $f_1$ to $(M+\frac{1}{2})$ times $f_f$ where M is a small integer. This also locks the frequency $f_0$ to $f_1$ by setting the ratio of $f_0/f_1$ equal to $(2N+1)/(2M+1)$. This relationship can be utilized in conjunction with a stable source of radio frequency $f_1$ to stabilize the optical frequency $f_0$ or, conversely, can be used with a stable source of optical frequency $f_0$ to stabilize the source of radio frequency $f_1$.

In the same way that the cosine and sine functions in a Fourier expansion of a given function can be viewed as vectors in an infinite dimensional function space in which a norm is defined by an integral, the first and second reference signals can be viewed as a pair of reference vectors. The phase synchronous integrations performed by the phase synchronous amplifiers measure the amount of each of these two vectors contained in the detector output signal. Thus, each control signal is a measure of the amount of its associated reference vector contained in the detector output signal.

The first reference signal is chosen so that the first control signal goes to zero as $f_0-(N+\frac{1}{2})*f_f$ approaches zero, but does not go to zero as $f_1-(M+\frac{1}{2})*f_f$ goes to zero. Similarly, the second reference signal is chosen so that the second control signal goes to zero as $f_1-(M+\frac{1}{2})*f_f$ goes to zero, but does not go to zero as $f_0-(N+\frac{1}{2})*f_f$ goes to zero. With this choice of reference signals, the first and second servo loops are effective to lock $f_0$ to $(N+\frac{1}{2})*f_f$ and $f_1$ to $(M+\frac{1}{2})*f_f$, respectively.

In order to determine M and N, both of the reference signals and their negatives are utilized in sequence as phase reference inputs to the first phase synchronous amplifier to step the ratio $f_0/f_f$ from $N+\frac{1}{2}$ to $N+P+\frac{1}{2}$. Typically, the ratio $f_0/f_f$ is varied by varying only one of $f_0$ and $f_f$. In those circuits in which $f_f$ is varied, $f_1/f_2$ is measured at each of these ratios of $f_0/f_f$. These two values and the value of P are used to determine $(2N+1)/(2M+1)$. The value of M can be determined by a number of methods including: (1) a rough knowledge of $f_1$ and the dimensions of the cavity; or (2) additional measurements of frequencies when M is stepped between a pair of values in a manner equivalent to that just discussed in which the value of N is stepped between a pair of values.

In general, first order frequency dispersion in such elements as the mirrors in the interferometer will introduce a delay D that is typically unknown. This delay produces a shift in the servo locking condition of loop 2 such that $(N+\frac{1}{2})/f_0$ still equals $1/f_f$, but now $(M+\frac{1}{2})/f_1$ is equal to $D+1/f_f$. Therefore, $(M+\frac{1}{2})*(1/f_1'-1/f_1)$ is still equal to $P/f_0$ independent of the value of D. Therefore, this method for determining N is not affected by the unknown delay D. N is affected in just the right way so that the determined value of N corrects the calculated $f_0$ for the effects of D.

DESCRIPTION OF THE FIGURES

FIG. 8A is a table of the amplitude of a control signal produced by a phase synchronous amplifier in response to four different phase signals.

FIG. 8B is a simplified version of the table of FIG. 8A emphasizing the functional dependence of the entries in the table.

DESCRIPTION OF THE PREFERRED EMBODIMENT

Figure 1:
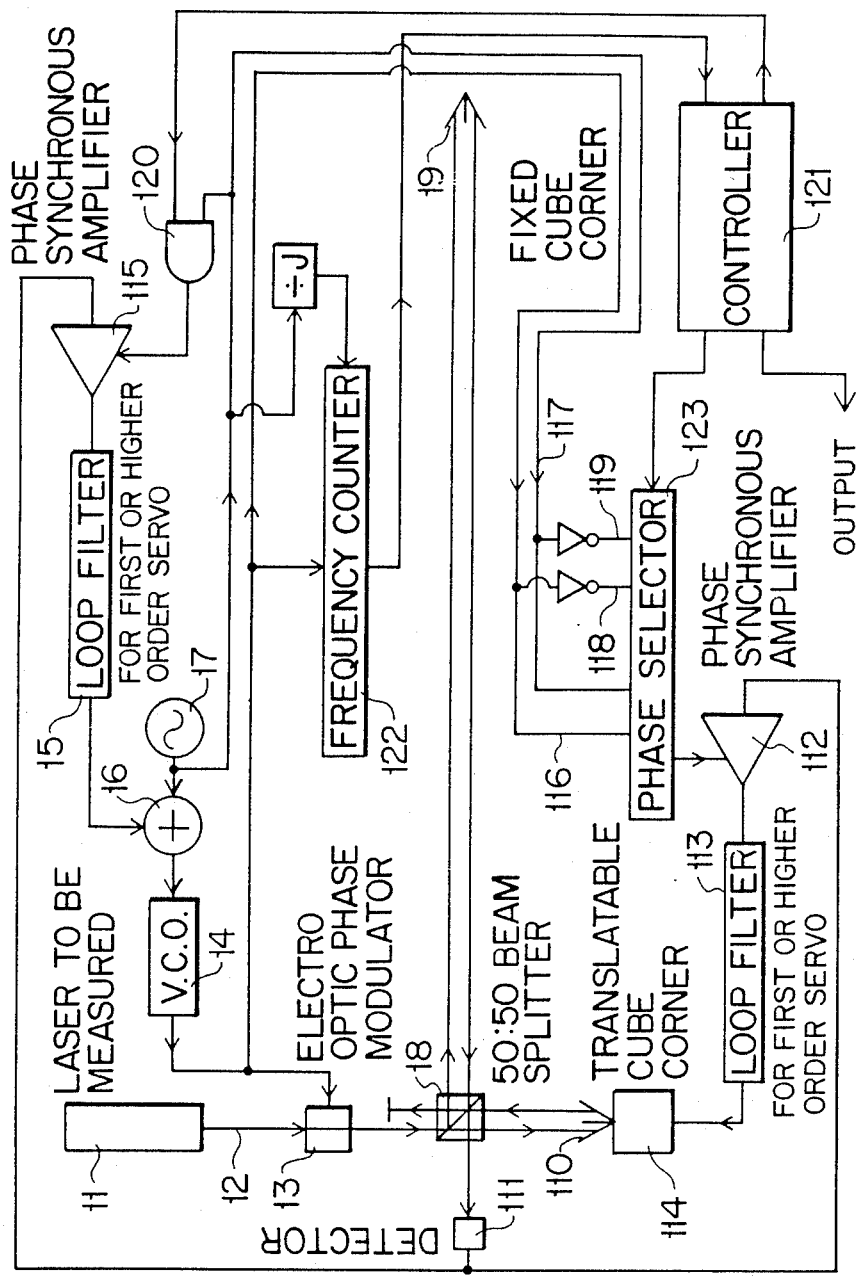
FIG. 1 is a block diagram of a circuit for indirectly setting a first frequency to a fixed multiple of a second frequency.

In the following discussion, the first digit of a reference number indicates the first Figure in which that reference numeral appears. In addition, equivalent or analogous elements in different Figure will generally have reference numbers that differ only in the first digit.

In FIG. 1 is shown a circuit suitable for locking a signal of radio frequency $f_1$ to a signal of optical frequency $f_0$. A coherent continuous wave source of collimated light, such as laser 11, produces an optical beam 12 of frequency $f_0$ that passes through an electrooptic phase modulator 13 to phase modulate the optical beam. Phase modulator 13 is responsive to the output signal from a voltage controlled oscillator (VCO) 14. A bias signal produced by a loop filter 15 is added in an adder 16 to a signal of radio frequency $f_2$ produced by an RF source 17. The sum of these two signals is applied to the control input of VCO 14 so that the RF component introduces frequency modulation of the VCO frequency and the bias signal from loop filter 15 adjusts the average VCO frequency. As a result of this, beam 12 is phase modulated by a modulation signal that itself is frequency modulated at frequency $f_2$. As discussed below, the choice of bias signal is made to lock the average frequency $f_1$ of the VCO to $M+\frac{1}{2}$ times a fundamental frequency $f_f$ of an interferometer, where M is a small integer.

The effect of this modulation of the optical beam can be visualized by a plot of the spectral composition of the optical beam. Using trigonometric identities, it is easily shown that an amplitude modulated signal $$(A+2B*\cos(2\pi f_m t))*\cos(2\pi c t)$$

is equal to $$A * \cos(2\pi f_c t) + B * \cos[(2\pi f_c + 2\pi f_m)t] + B * \cos[(2\pi f_c - 2\pi f_m)t]$$

and a phase modulated signal $A * \cos[2\pi f_c t + (2B/A) * \sin(2\pi f_m t)]$ to first order in B is equal to $$A * \cos(2\pi f_c t) + B * \cos[(2\pi f_c + 2\pi f_m)t] - B * \cos[(2\pi f_c - 2\pi f_m)t]$$

Figure 2A:
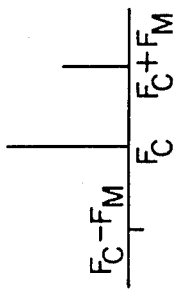
FIG. 2A is a spectral distribution of an amplitude modulated signal.
Figure 2B:
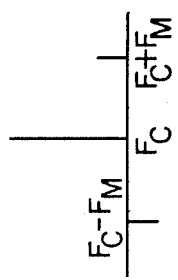
FIG. 2B is a spectral distribution of a phase modulated signal.
Figure 2C:
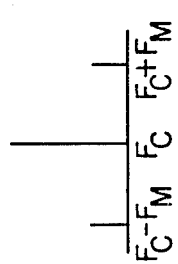
FIG. 2C is a spectral distribution of a signal that is both phase and amplitude modulated.

The spectral distribution for the amplitude modulated signal is shown in FIG. 2A and the spectral distribution for the phase modulated signal is shown in FIG. 2B. In both of these figures the spectral distribution shows the carrier frequency at $f_c$ plus a pair of side bands at $f_c \pm f_m$. In FIG. 2C is shown the spectral distribution for a signal of frequency $f_c$ that is both amplitude and phase modulated at frequency $f_m$. For pure phase modulation, the following two criteria must be met: (i) the phase of the upper side band minus the phase of the carrier must at all times be equal, mod $2\pi$, to $\pi$ plus the phase of the carrier minus the phase of the lower side band; and (ii) the amplitude of the upper side band must equal the amplitude of the lower side band.

Figure 2D:
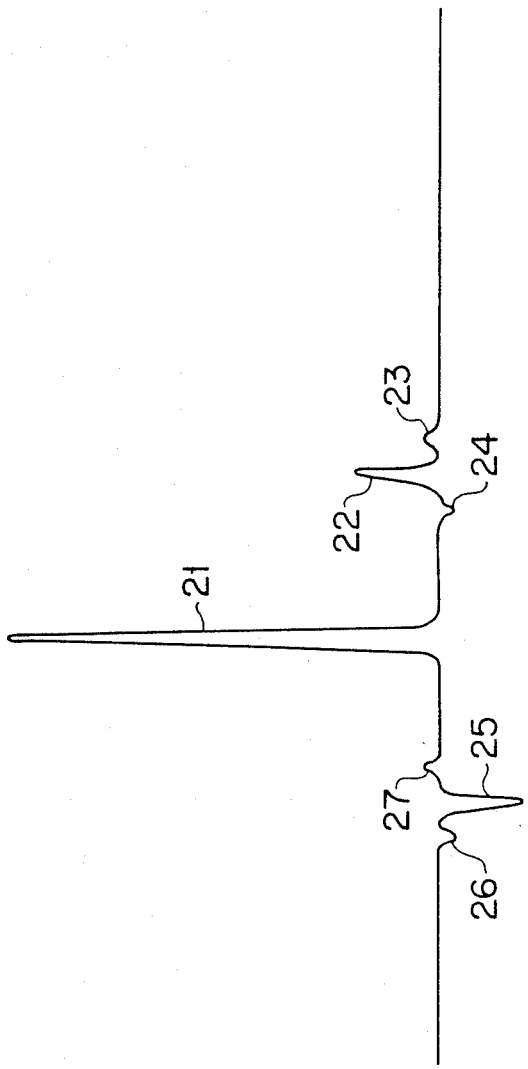
FIG. 2D is a spectral distribution of a signal that is phase modulated by a signal that is itself phase modulated.

In FIG. 2D is shown the spectral distribution for optical beam 12 after passing through modulator 13. Beam 12 contains a carrier component 21 at frequency $f_0$ which is phase modulated as a result of sideband clusters 22-24 and 25-27. Each of the sideband clusters has the form of FIG. 2B because they each represent the phase modulated signal applied by VCO 14 to the control input of modulator 13. If this beam were incident on a detector, the detector signal would be constant because the modulation of the beam is pure phase modulation. However, if the relationship between the components of the beam are disturbed in a way that violates either criterion (i) or criterion (ii) above for pure phase modulation, then the detector signal will not be constant.

In the circuit of FIG. 1, the relationship between the components of phase modulated optical beam 12 are disturbed by passing the beam through a filter before detecting the beam with a detector 111. The transfer function $T*e^{-ip}$ disturbs the relationship between the components that produces a purely phase modulated signal. In FIG. 1, the Michelson interferometer (consisting of beam splitter 18, fixed cube corner 19 and translatable cube corner 110) functions as a filter having properties that enable the optical frequency $f_0$ to be locked to the average frequency $f_1$ produced by VCO 14.

Figure 3:
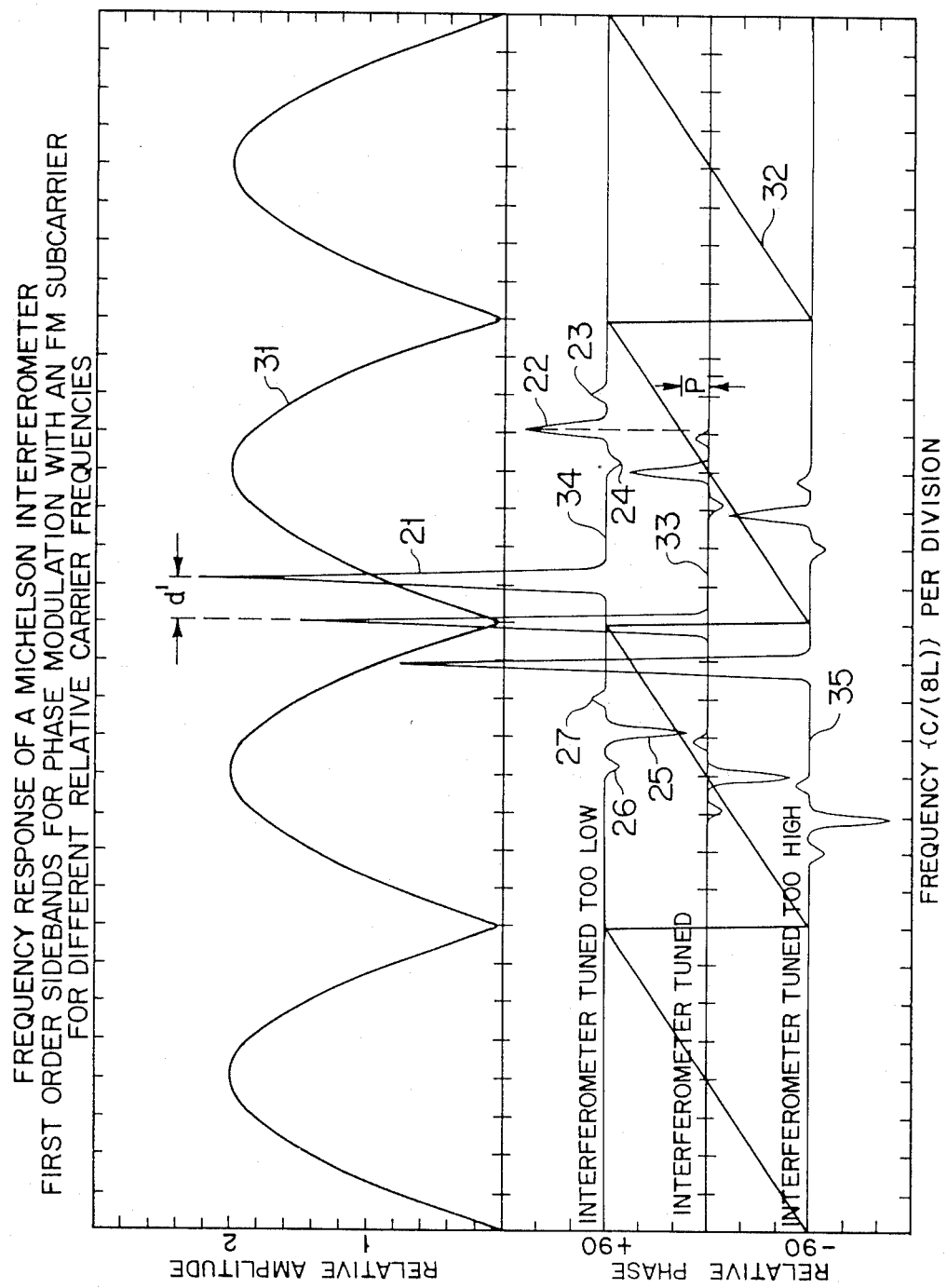
FIGS. 3 and 4 illustrate the effect of the transfer function of a Michelson interferometer on a signal of the type presented in FIG. 2D.
Figure 4:
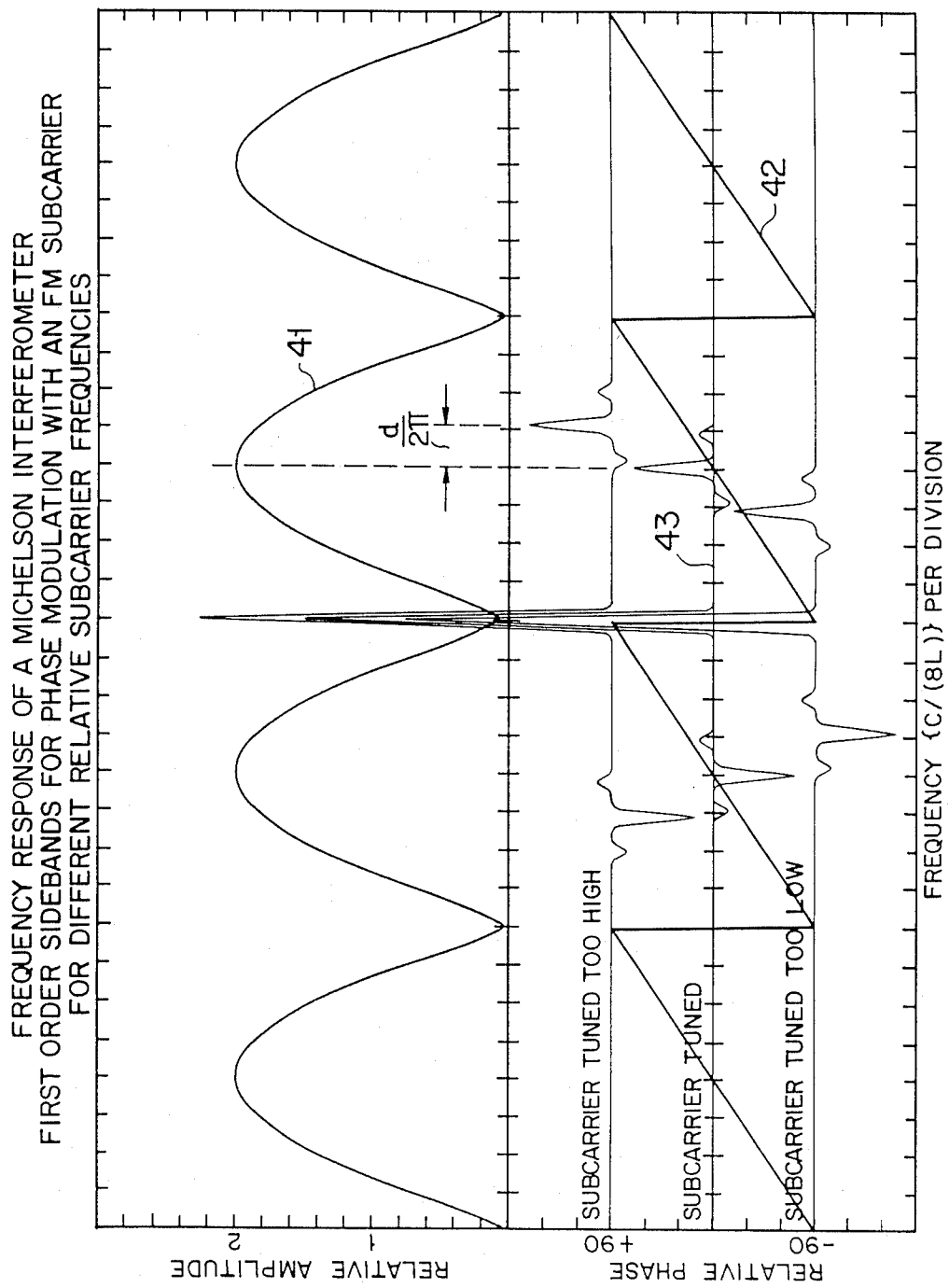

In FIGS. 3 and 4 are shown, as a function of frequency, the amplitude T (curves 31 and 41) and phase p (curves 32 and 42) of the transfer function of the Michelson interferometer. Both T and p are periodic with a period c/L where c is the speed of light in the interferometer and L is the excess path length for the portion of the beam that travels to cube corner 19 over the path length for the portion of the beam that travels to cube corner 110. In addition, at each extremum of the amplitude curve T, curve p is antisymmetric about that point and curve T is symmetric about that point.

Curves 33-35 and 43-45 show the components of the optical beam before passage through the interferometer. After passage through the interferometer, the resulting amplitude curve for the spectral distribution of the optical beam is the product of curves 33-35 with curve 31 and the product of curves 43-45 with curve 41. Curves 32 and 42 show the amount of phase shift introduced into each of the components as a function of the frequency of each component. It should be remembered that the negative amplitude of component 25 is really an indication that the phase difference between components 25 and 21 is 180 degrees out of phase with respect to the phase difference between components 21 and 22. As a result of the symmetries of curves 31, 32, 41, and 42, when the carrier frequency component 21 is located at an extremum of T and the primary sidebands 22 and 25 are located at another extremum, criteria (i) and (ii) for pure phase modulation continue to hold so that the output signal from detector 111 is constant. This relationship is shown in FIGS. 3 and 4 as curves 33 and 43, respectively. When this relationship of components 21, 22, and 25 to extrema of T does not exist, the output signal from detector 111 is not constant. Components of the output signal are utilized in the circuit of FIG. 1 to establish the relationship shown in curves 33 and 43.

A first servo loop containing a first phase synchronous amplifier 112, a first loop filter 113 and a translator 114 are utilized to adjust $f_f$ so that $f_0$ is equal to a half integral multiple $N+\frac{1}{2}$ times $f_f$. Amplifier 112 is responsive to the output of detector 111 and to a first reference signal to produce a first control signal proportional to the filtered product of the first reference signal and the detector output signal. The loop filter has a transfer function that makes the first servo loop stable and of order 1 or higher (i.e., at least one integration in the open loop transfer function).

A translator 114 translates cube corner 110 in a direction that varies the distance of cube corner 110 from beam splitter 18. This translation varies the fundamental frequency $f_f$ of the interferometer, thereby altering the ratio between $f_0$ and $f_f$. The position of the cube corner along the direction of translation is proportional to the output signal from loop filter 113. A suitable translator includes in series a motor and a piezoelectric crystal. The motor enables slow long translations to be performed and the piezoelectric crystal provides a fast short response for the first servo loop. The first control signal is chosen to approach zero as $f_0/f_f$ approaches $N+\frac{1}{2}$ where N is an integer so that translation of cube corner 110 stops when the half integral ratio between $f_0$ and $f_f$ is established.

A second servo loop containing a second phase synchronous amplifier 115, a second loop filter 15 and an adder 16 are utilized to lock $f_1$ to a half integral multiple $M+\frac{1}{2}$ of $f_f$. Typically, M will be a small number on the order of 1-10 whereas N will be several orders of magnitude larger to enable an optical frequency (typically on the order of 500 TeraHertz) to be locked to a radio frequency (typically on the order of 500 MegaHertz). Amplifier 115 is responsive to the output of detector 111 and to a second reference signal to produce a second control signal proportional to the filtered product of the second reference signal and the detector output signal. The loop filter has a transfer function that makes the second servo loop stable and of order 1 or higher (i.e., at least one integration in the open loop transfer function). The application of this servo output signal to VCO 14 controls the average frequency $f_1$ of the VCO, thereby altering the ratio between $f_1$ and $f_f$. The second control signal is chosen to approach zero as $f_1/f_f$ approaches $M+\frac{1}{2}$ where M is an integer so adjustment of the average VCO frequency stops when the half integral ratio between $f_1$ and $f_f$ is established.

Because loop filters 15 and 113 each integrate the control signal applied at its input, each servo loop will establish a stable lock condition only when the control signal becomes zero. The radio frequency $f_1$ is indirectly locked to optical frequency $f_0$ by separately locking some multiple L of $f_f$ to $f_0$ and $f_1$ to some multiple K of $f_f$. For each lock condition to be independent of the other lock condition, it is necessary that: (1) the first control signal goes to zero as $f_0/f_f$ approaches L, but does not go to zero as $f_1/f_f$ approaches K; and (2) the second control signal goes to zero as $f_1/f_f$ approaches K, but does not go to zero as $f_0/f_f$ approaches L. To see that this is necessary, note that if condition (1) holds, but condition (2) does not hold, then when the first servo loop is in a lock state, both control signals are zero regardless of whether the second servo loop is in a lock state. This prevents the second servo loop from adjusting $f_1/f_0$ to a lock state condition. To determine what reference signals are suitable for achieving both of conditions (1) and (2) above, it is necessary to look at the variation of the output signal from detector 111 as $f_f$ is varied relative to $f_0$ and $f_1$ is varied relative to $f_f$.

The output signal from detector 111 is proportional to the intensity I of beam 12 at detector 111. The intensity is itself equal to $S*S^*$ where S is the complex amplitude of the optical signal and $S^*$ is the complex conjugate of S. This product of S and $S^*$ contains cross products between the components of the optical signal. Detector 111 functions as an integrator that averages the optical signal over a time that is long compared to $1/f_0$, but is short compared to $1/f_1$ and $1/f_2$. Therefore, components of I at optical frequencies average to zero, thereby leaving only components at linear integral sums of $f_1$ and $f_2$. The control signals are each a linear function of the detector signal so that control signals that satisfy criterion (1) of the previous paragraph can be generated by determining which of the components of the detector output signal vanish as $f_0/f_f$ approaches L, but do not vanish as $f_1/f_f$ approaches a half integer. As indicated above, the optical beam is purely phase modulated when $f_0$ and $f_0 \pm f_1$ are located at extrema (e.g., as for curves 33 and 43 in FIGS. 3 and 4, respectively) so that the output signal from the detector is constant under such conditions. Therefore, all components of the detector output signal, other than its DC component, are zero when this condition is established. Thus, control signals proportional to components of the detector output signal will be assured to vanish when these relationships are established. When this occurs, $f_0$ and $f_1$ are each at some extremum of T and therefore are each some integral multiple of $f_f/2$. Equivalently, K and L are both some integral multiple of $\frac{1}{2}$.

Those components that become nonzero when $f_0$ and/or $f_0 \pm f_1$ are moved a small distance away from the extrema are suitable prospects for use in generating the control signals. In FIG. 3, curve 33 represents the case where $K=\frac{1}{2}$ and $L=N+\frac{1}{2}$ for some integer N. Curves 34 and 35 represent the case where K is held at $\frac{1}{2}$, but $f_0$ is varied a small amount d' away from $(N+\frac{1}{2})*f_f$. Under these conditions, the detector output signal has components at $f_1$ and at $f_1 \pm f_2$. To see this, note that the component of the detector output signal at $f_1$ arises from the cross terms in $S*S^*$ of peak 22 with peak 21 and peak 25 with peak 21. Because of the symmetry of curve 31, peaks 22 and 25 are clipped equally so that criterion (ii) for pure phase modulation at frequency $f_1$ continues to hold. However, condition (i) is violated because components 21, 23 and 25 pick up phase shifts of minus 90 degrees plus $p_1$, $p_1$ and $p_1$, respectively. The component of the detector output signal at $f_1+f_2$ arises from the cross terms of component 23 with 21 and component 26 with 21. Likewise, the component of the detector output signal at $f_1-f_2$ arises from the cross terms of component 24 with 21 and component 27 with 21. The same reasoning as used to show the existence of a component at $f_1$ shows that there are also components in the detector output signal at $f_1 \pm f_2$. Because these components are nonzero even when $f_1$ is an integral multiple of $f_f/2$, each of these components separately or in linear combination are suitable for use as the first reference signal. In particular, the linear combination of these components representing the output signal from VCO 14 is a suitable choice. Therefore, in the circuit of FIG. 1, the output of VCO 14 is connected to the first phase input of the phase selector to provide the first reference signal to the first phase synchronous amplifier.

The component of the detector output signal at $f_2$ arises from the cross terms of component 23 with 22, component 24 with 22, component 26 with 25 and component 27 with 25. However, the cross term of component 23 with 22 cancels the cross term of component 27 with 25 and, likewise, the cross term of component 24 with 22 cancels the cross term of component 26 with 25. Therefore, for K held at $\frac{1}{2}$, there is no component of the detector output signal at $f_2$. This same reasoning in regard to FIG. 4 shows that when L is held at $N+\frac{1}{2}$, the only component in the detector output signal, other than the DC component, is the component at $f_2$. Therefore, The output of signal source 17 is utilized to provide the second reference signal to the second phase synchronous amplifier. Thus, the first and second servo loops independently function to lock the multiple $N+\frac{1}{2}$ of $f_f$ to $f_0$ and to lock $f_1$ to the multiple $\frac{1}{2}$ of $f_f$.

This same analysis shows that the first servo loop will function to lock L times $f_f$ to $f_0$ whenever L is either an even or an odd integral multiple of $\frac{1}{2}$. However, the first servo loop will lock $L*f_f$ to $f_0$ only if $f_1$ is an odd multiple of $f_f/2$ (i.e., $(M+\frac{1}{2}) *f_f$). Therefore, K must be an odd multiple of $\frac{1}{2}$. Although the first servo loop will function to lock with $f_0$ at either a maximum or a minimum of curve 31 (i.e., for $f_0$ either an even or an odd multiple of $f_f$), by setting $f_0$ to a minimum, the carrier component in the detector output signal is suppressed, thereby increasing the signal to noise ratio for both control signals. Therefore, it is advantageous to select L to be an odd integral multiple of $\frac{1}{2}$.

Figure 5:
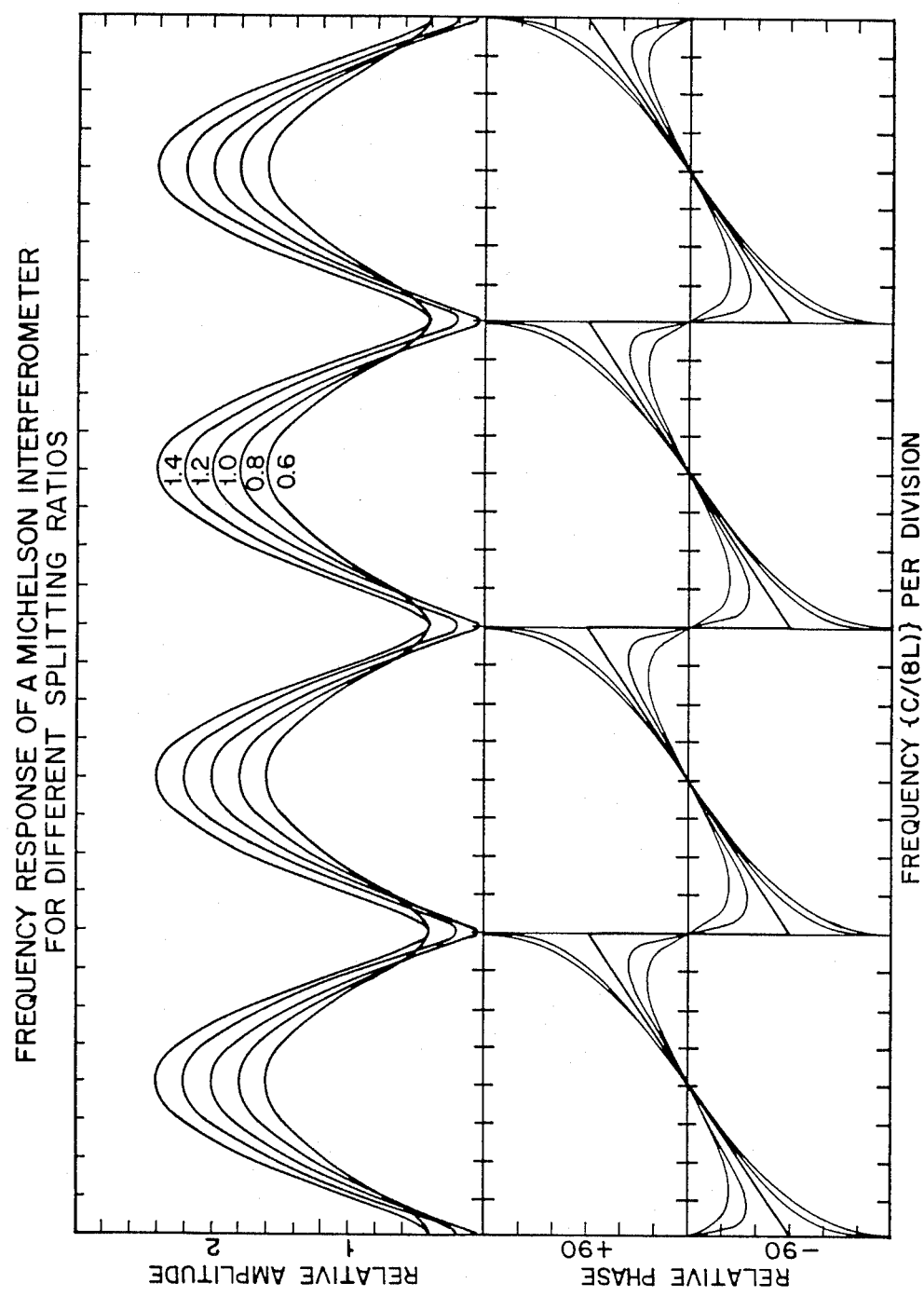
FIG. 5 shows the amplitude and phase components of the transfer function of a Michelson interferometer.

The transmission curves 31, 32, 41, and 42 are for the case of a Michelson interferometer having equal splitting at beam splitter 18 (i.e., the electric field amplitude in the long path between splitter 18 and cube corner 19 is equal to the electric field amplitude in the short path between splitter 18 and cube corner 110). When this is not the case, the transmission curves are altered. In FIG. 5 are a set of curves for both T and p for various ratios of splitting. These curves present, as a function of frequency, the ratio between: (1) the electric field at detector 111 when light from both the short and long paths are combined as input to the detector; and (2) the electric field at detector 111 when the short path is blocked so that only light from the long path is provided as input to the detector. The values 0.6–1.4 represent the ratio of: (1) the amplitude of the electric field at cube corner 110 to the amplitude of the electric field at cube corner 19. These curves show that the symmetries of the amplitude and phase curves continue to hold for unequal beam splitting so that interferometers can be used which do not have equal beam splitting.

Figure 6:
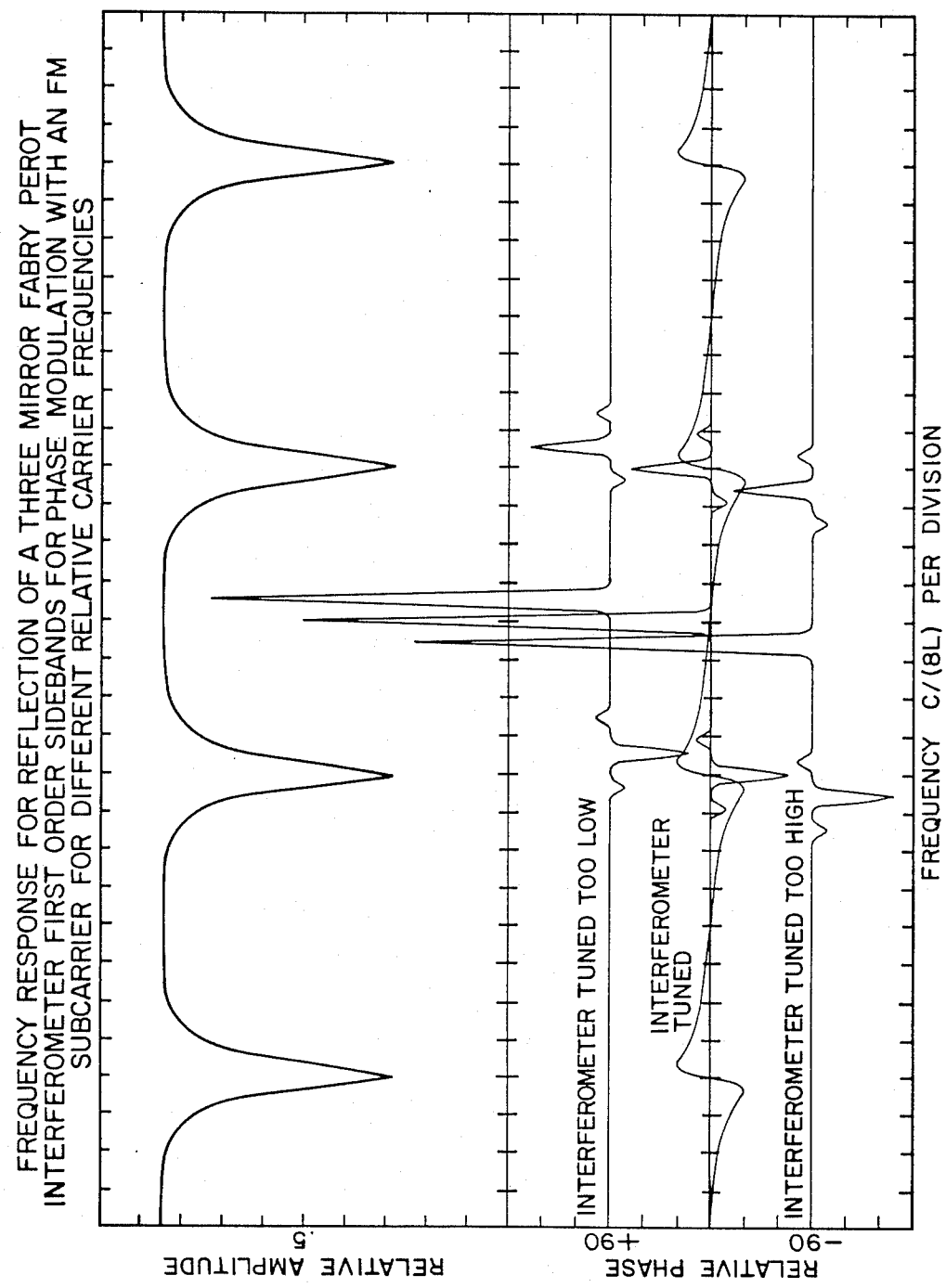
FIGS. 6 and 7 illustrate the effect of the transfer function of a Fabry Perot interferometer on a signal of the type presented in FIG. 2D.
Figure 7:
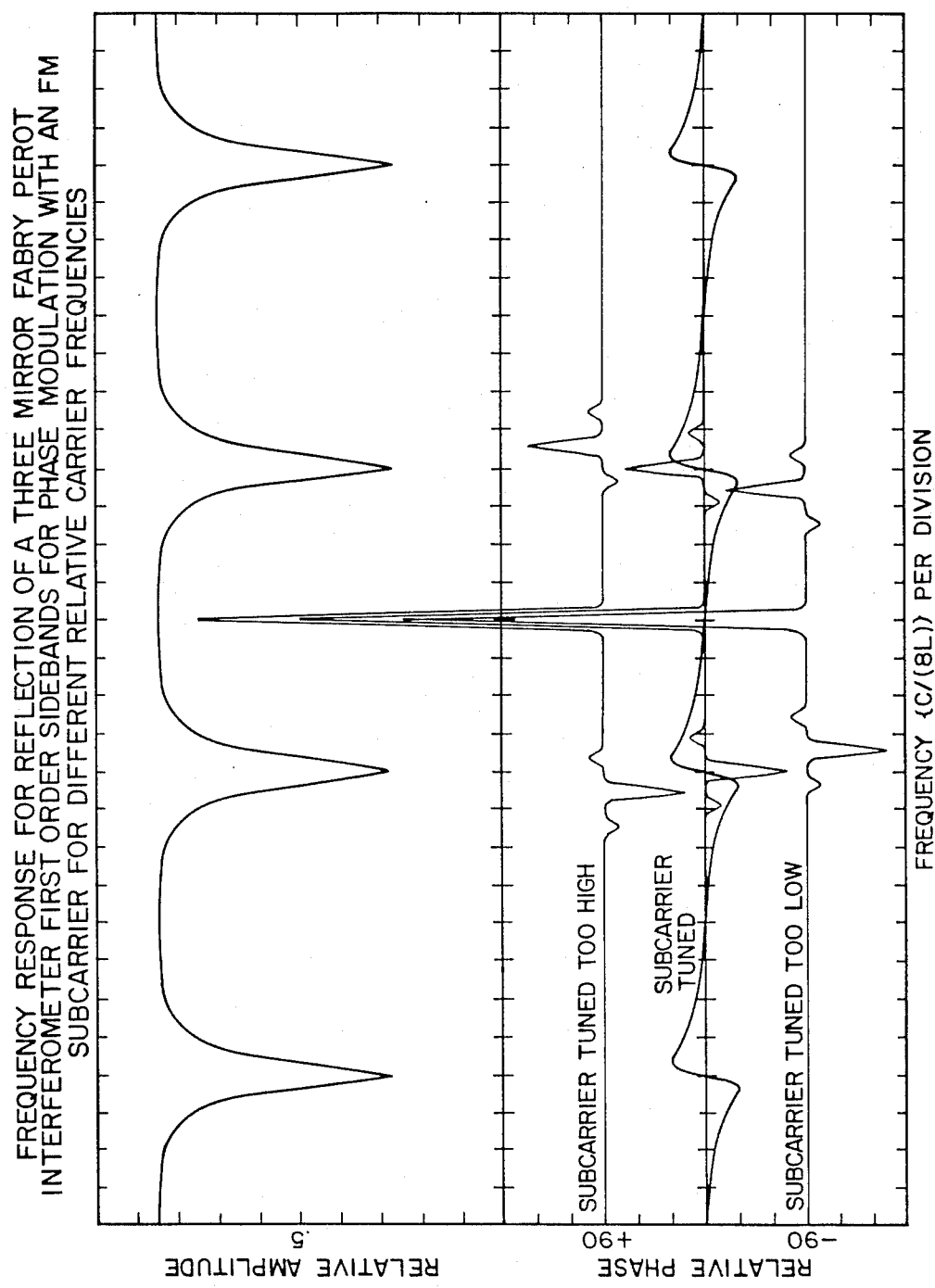

Other types of interferometers, such as a Fabry Perot interferometer can be used in place of the Michelson interferometer. In FIGS. 6–7 are shown transfer function curves for a Fabry Perot interferometer operating in reflection mode that are analogous to the curves presented in FIGS. 3–4 for a Michelson interferometer. These curves exhibit the same type of symmetry as do the curves for the Michelson interferometer—namely, both the transmission curves have a common period and, at each point of symmetry of the amplitude curve, the phase curve is antisymmetric. Therefore, the analysis above for a circuit utilizing a Michelson interferometer is also applicable to a circuit utilizing a Fabry Perot interferometer.

Because the curves for the Fabry Perot interferometer have sharper transitions than do the curves for the Michelson interferometer, a larger control signal is produced for a given amount of detuning from the lock conditions. This increases the signal to noise ratio, therby making the use of the embodiment using a Fabry Perot interferometer more advantageous for applications in which the radio frequency $f_1$ is used to stabilize the optical frequency $f_0$ or conversely. Unfortunately, in the Fabry Perot interferometer, in order to have high finesse mirrors, the mirrors have many layers of coating which introduce a larger dispersion than is introduced in a Michelson interferometer. In addition, the Fabry Perot interferometer does not have high finesse over a broad spectral range. Therefore, a Michelson interferometer is more suitable for use in a circuit utilized as a wave meter.

In FIG. 1, additional elements are included that enables the value of $f_0$ to be determined. In order to determine $f_0$, the values of M, $f_1$, $f_2$ and N must be determined. M can be determined by knowledge of the approximate value of $f_1$ and the path difference between the long and short paths of the interferometer. $f_2$ is a radio frequency and therefore is directly measurable. N and $f_f$ are determined by measuring the ratio $f_1/f_2$ for $f_0/f_f$ equal to $N+\frac{1}{2}$ and then again for $f_0/f_f$ equal to $N+Q+\frac{1}{2}$ where Q is known. In order to increase N by Q, a phase selector 123 is included to select among four possible signals for use as the first reference signal applied to the first phase synchronous amplifier 112. The four choices of signal, applied to phase selector 123 at inputs 116–119, are: (1) the output signal of VCO 14; (2) the output signal of RF source 17; (3) minus the output signal of VCO 14; and (4) minus the output signal of RF source 17. These four choices are referred to herein as the first phase signal, the second phase signal, the third phase signal and the fourth phase signal, respectively. These four choices are utilized sequentially to step the lock point of the first servo loop from an initial value $(N+\frac{1}{2}) *f_f$ to a final value of $(N'+\frac{1}{2}) *f_f$. The manner in which this stepping occurs can be seen by reference to FIGS. 8A and 8B.

In FIG. 8A is presented a table showing the amplitude of the first control signal that results for each of the four choices of phase signal. In that table, $I_0$ is a proportionality constant determined by the detector and the first phase synchronous amplifier, $P_0$ is the maximum phase swing produced by electrooptic phase modulator 13, $d/2\pi$ equals $f_1-(M+\frac{1}{2}) *f_f$ and E is the amplitude of the sinusoidal change in the output frequency from VCO 14. The second phase synchronous amplifier 115 is designed to produce a negative value for d when the second servo loop is disabled. A gate 120 is included to enable the second servo loop to be controllably disabled. Phase selector 123 and gate 120 are responsive to signals from a controller 121 to control the sequential use of the phase signals and to calculate N and $f_o$.

Figure 9:
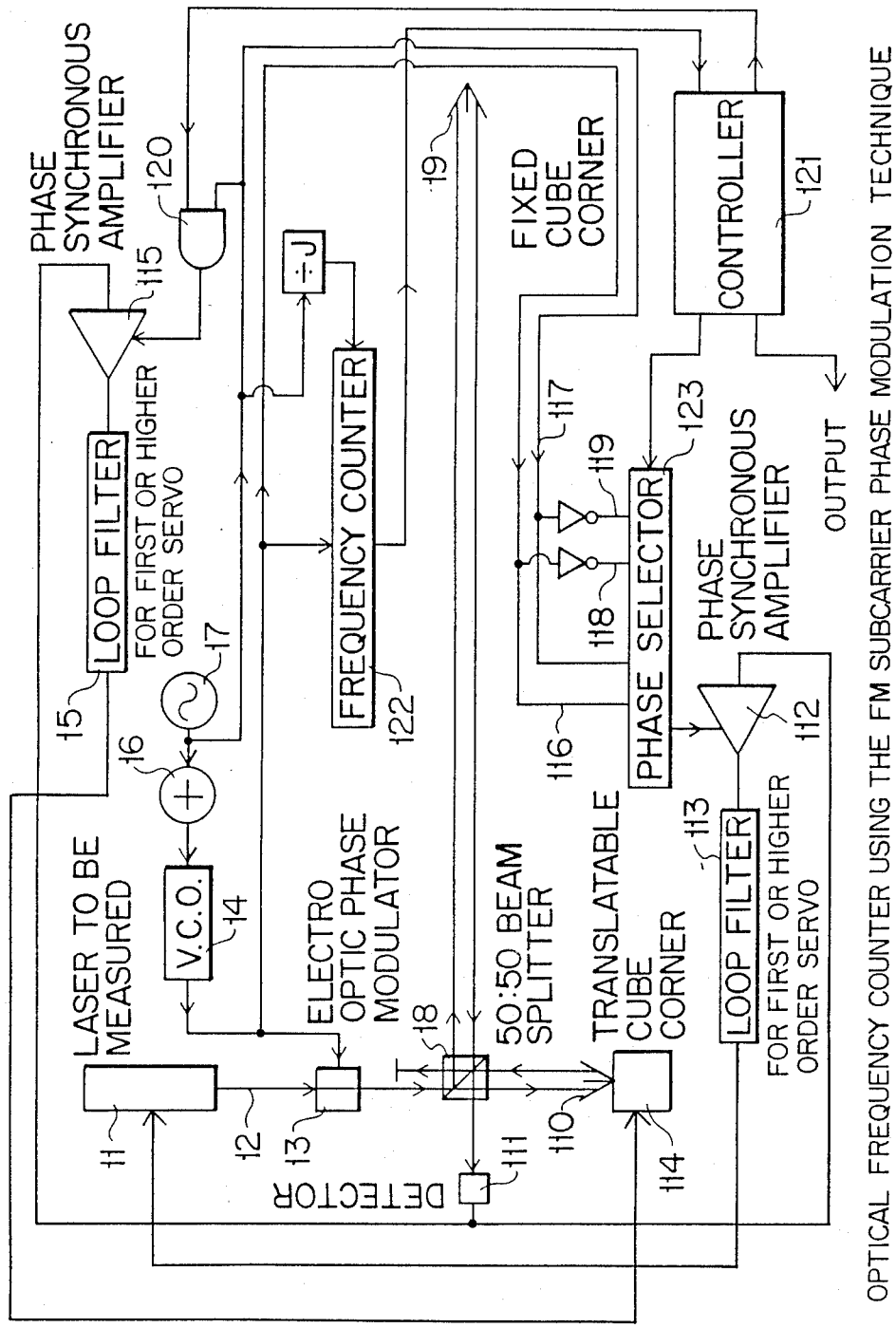
FIG. 9 is an embodiment in which an optical frequency $f_0$ is locked to a reference frequency $f_1$.

In FIG. 8B, the table of FIG. 8A has been rewritten to stress the qualitative behavior of the control signal for each of the choices of input phase signal when the second servo loop is disabled—namely, the multiplicative constants of FIG. 9A have been removed, but the sign of each term has been retained. First, the second servo loop is disabled by gate 120. Since the first servo loop is still enabled, $f_0$ remains equal to $(N+\frac{1}{2})*f_f$. Phase selector 123 next applies the second phase signal. This produces a positive control signal that adjusts the position of cube corner 110 to vary $f_f$ until $f_0$ is equal to $(N+\frac{3}{4})*f_f$. The subsequent application of the third phase signal followed by application of the fourth phase signal and then again the first phase signal successively adjusts $f_f$ to produce successively the ratios $N+1$, $N+5/4$, and $N+1+\frac{1}{2}$ for $f_0/f_f$. This sequence is repeated Q times to change the ratio of $f_0/f_f$ from $N+\frac{1}{2}$ to $N'+\frac{1}{2}$ where $N'=N+Q$. The second servo loop is then enabled by gate 120 so that $f_1$ is locked to $(M+\frac{1}{2})*f_f$ and therefore can be measured.

There are two modes of operation. The first mode is the measurement mode where $f_0/f_f$ is alternately stepped back and forth between $N+\frac{1}{2}$ and $N+Q+\frac{1}{2}$ with $f_f$ being measured at both of these points. To measure $f_f$, a frequency counter counts the number of cycles of the VCO that occur in J cycles of signal source 17. By counting over an integral number of cycles of source 17, the effect of the periodic variation of the VCO frequency is removed. Therefore, the number of cycles counted divided by J is equal to $f_1/f_2$. Since J, M and $f_2$ are known, $f_f$ is determined for both the ratio N and N' for $f_0/f_f$. Letting $f_{f1}$ equal the value of $f_f$ when $f_0/f_f=N+\frac{1}{2}$ and letting $f_{f2}$ equal the value of $f_f$ when $f_0/f_f=N+Q+\frac{1}{2}$, we find that $$N+Q+\tfrac{1}{2}=f_0/f_{f2} \text{ and}$$

$$N+\tfrac{1}{2}=f_0/f_{f1}.$$

Therefore, $$f_0=Q*f_{f1}*f_{f2}/(f_{f1}-f_{f2}) \text{ and}$$

$$N=Q*f_{f2}/(f_{f1}-f_{f2})-\tfrac{1}{2}.$$

Since $(2N+2Q+1)/(2M+1)$ is the ratio of $f_0$ to $f_1$ and this ratio is now known, as long as both servo loops retain their lock condition, there is a known fixed relationship between $f_0$ and $f_1$. Therefore, the circuit can now be used in a tracking mode in which $f_1$ is measured and this known factor is used to determine $f_0$. This ability to measure $f_0$ for a wide range of values of N enables this circuit to function as a broadband wavemeter at optical frequencies.

It should be noted that, although in FIG. 1, the VCO frequency is locked to the laser frequency, this same technique can be utilized to lock the laser frequency to the VCO frequency. To do this, the output of first loop filter 113 would be applied to laser 11 to adjust its frequency and the output of second loop filter 15 would be applied to translater 114 to adjust the frequency $f_f$. This version of the technique enables a laser to be stabilized by a stable RF source, thereby providing an accurate frequency source at optical frequencies.

The value of M can be stepwise varied in the same manner disclosed above for stepping N. This can be achieved by including in the second servo loop a phase selector that selects a sequence of phase signals to be applied to the second phase synchronous amplifier and including a gate to disable the first servo loop such that when the first servo loop is disabled, $f_0/f_f=N+\frac{1}{2}+x$ where $0<x<\frac{1}{2}$. Also, it is not necessary that four phase signals be used. The stepping through successive values of K or L is analogous to stepping through successive angles of a stepper motor. Therefore, it is only necessary that at least three phase signals be utilized.

The above method of calculating N and $f_0$ only requires that $f_f$ be measured after N has been changed by a known amount Q. Therefore, instead of using the above stepper method to step N by an amount Q, an alternative technique is to unlock both servo loops, to translate cube corner 110 to alter $f_f$ and to somehow measure Q. One way of measuring Q is to interrupt both loops at the output of both phase synchronous amplifiers and to monitor the signals produced at these points. As the table in FIG. 8B indicates, these signals vary periodically out of phase with one another, so that these two signals can be used in the technique of directional quadrature counting to determine Q.

It should also be noted that instead of frequency modulating beam 12 with a signal that is itself purely phase modulated, beam 12 could be modulated with a signal that is purely amplitude modulated or is partly phase modulated and partly amplitude modulated. As a special case of pure amplitude modulation, one possible choice of control signal to phase modulator is a signal that is the sum of two signal of frequency $f_1$ and $f_2$, where $f_1$ is the VCO frequency, $f_2$ is a fixed frequency, $f_1=f_f+d/2\pi$ and $0<f_2<f_f/2$. The loop 2 phase reference would then be $\sin 2\pi(f_1-f_2)t$. Phase 1 through phase 4 for the phase selector would then be $\sin(2\pi f_2 t)$, $\sin(2\pi(f_1-f_2)t)$, $-\sin(2\pi f_2 t)$ and $-\sin(2\pi(f_1-f_2)t)$, respectively.

I claim:

1. A method of determining the value of a first frequency $f_0$, said method comprising the steps of:
    (a) for a measurable frequency $f_f$, setting the ratio of $f_0/f_f$ to a controllable value L;
    (b) measuring the value $f_{f1}$ of $f_f$ for L equal to an initial value $L_0$;
    (c) for fixed $f_0$, incrementing L by a known amount Q to a value $L'=L_0+Q$;
    (d) measuring the value $f_{f2}$ or $f_f$ when $f_0=L'*f_f$; and
    (e) calculating $f_0$ in terms of Q, $f_{f1}$ and $f_{f2}$.

2. A method as in claim 1 wherein $f_0/f_f$ is set to said value L in response to a control signal $C_0$ that is a periodic function of $f_0$ with period $f_f$.

3. A method as in claim 2 wherein step (c) comprises:
    for $k=1, \ldots, p$ for some integer $p>2$ and for a set of control signals $C_0, \ldots, C_p$, each is a periodic function of $f_0$ with a period $f_f$:
    (f) replacing the $(k-1)$st control signal $C_{k-1}$ with the kth control signal $C_k$; and
    (g) locking $f_0/f_f$ to a value $L_k$ in response to the kth control signal.

4. A method as in claim 3 wherein the $L_k$ form a monotonic sequence for $k=0, \ldots, p$.

5. A method as in claim 4 wherein $C_p$ and $C_0$ are identical and wherein the absolute value of $L_p-L_0$ is equal to 1.

6. A method as in claim 5 further comprising the steps of:

for m=1, ..., q for some integer q>0, repeating steps (f) and (g) for each of k=1, ..., p;

wherein, in the gth repetition, in step (f), $f_0/f_f$ is set equal to $L_0+q$.

7. A method as in claim 3 further comprising the steps of:

(h) for a known frequency $f_1$, setting the ratio of $f_1/f_f$ to a controllable value K; and (i) measuring K.

8. A method as in claim 7 wherein $f_1/f_f$ is set to K in response to a control signal C' that is identical to one of the $C_k$.

9. A method as in claim 8 wherein p=4 and wherein $C_2 = -C_0 = -C_4$ and $C_3 = -C_1$.

10. A method as in claim 9 wherein $C' = C_1$.

11. A method as in claim 3 wherein p=4 and wherein $C_2 = -C_0 = -C_4$ and $C_3 = -C_1$.

12. A method of varying a frequency $f_0$, said method comprising the steps of:

(j) for a constant frequency $f_f$, in response to a control signal $C_0$ that is a periodic function of $f_0$ with period $f_f$, setting the ratio of $f_0/f_f$ to a controllable value L;

(k) for k=1, ..., p for some integer p>2 and for a set of control signals $C_0, ..., C_p$, each of which is a periodic function of $f_0$ with a period $f_f$;

(l) replacing the (k−1)st control signal $C_{k-1}$ with the kth control signal $C_k$; and (m) setting $f_0/f_f$ to a value $L_k$ in response to the kth control signal.

13. A method as in claim 12 wherein the $L_k$ form a monotonic sequence for k=0, ..., p.

14. A method as in claim 13 wherein $C_p$ and $C_0$ are identical and wherein the absolute value of $L_p - L_0$ is equal to 1.

15. A method as in claim 14 further comprising the steps of: for m=1, ..., q for some integer q>0, repeating steps (l) and (m) for each of k=1, ..., p;

wherein, in the qth repetition, in step (l), $f_0/f_f$ is set to $L_0+q$.

16. A method as in claim 15 wherein p=4 and wherein $C_2 = -C_0 = -C_4$ and $C_3 = -C_1$.

* * * * *